(12) United States Patent
Glenn (10) Patent No.: US 6,448,635 B1
(45) Date of Patent: Sep. 10, 2002

(54) SURFACE ACOUSTICAL WAVE FLIP CHIP

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/385,696

(22) Filed: Aug. 30, 1999

(51) Int. Cl.⁷ .......................................... H01L 23/495
(52) U.S. Cl. ................. 257/676; 257/671; 257/673; 257/692; 257/700; 257/730; 257/734
(58) Field of Search ................ 257/671–684, 257/777–786, 700, 730, 734

(56) References Cited

U.S. PATENT DOCUMENTS

| | | | |
|---|---|---|---|
| 4,530,152 A | 7/1985 | Roche et al. | 29/588 |
| 4,663,652 A | 5/1987 | Nishizawa | 357/74 |
| 4,691,225 A | 9/1987 | Murakami et al. | 357/80 |
| 4,760,440 A | 7/1988 | Bigler et al. | 357/74 |
| 4,801,998 A | 1/1989 | Okuaki | 357/72 |

(List continued on next page.)

FOREIGN PATENT DOCUMENTS

| | | | |
|---|---|---|---|
| EP | 0 562 550 A1 | 9/1993 | |
| JP | 52-10091 A | 1/1977 | |
| JP | 55-62777 A | 5/1980 | |
| JP | 59-167037 | 9/1984 | |
| JP | 61029158 | 2/1986 | |
| JP | SHO 62-9639 | 1/1987 | |
| JP | 02-77171 A | 3/1990 | |
| JP | 02307250 | 12/1990 | |
| JP | 10214923 | 1/1997 | |
| WO | WO 97/25847 | 7/1997 | |
| WO | WO 98/48461 | 10/1998 | H01L/31/02 |

OTHER PUBLICATIONS

Thompson, "All About ESD Plastics", *EE—Evaluation Engineering*, Jul. 1998, 6 pps.

Primary Examiner—Fetsum Abraham
(74) Attorney, Agent, or Firm—Skjerven Morrill LLP; James E. Parsons (57) ABSTRACT

A die mounting apparatus that includes: 1) a die including a bottom surface having an active region is located among the bottom surface and a first and second bond pads provided on the bottom surface outside of the active region; 2) a substrate including a top surface and protruding electrical contacts that are electrically coupled to the first and second bond pads; and 3) a first encapsulant circumscribing a periphery of the die, where the first encapsulant, the bottom surface of the die, and the top surface of the substrate define a free space. The first encapsulant extends inwards from the periphery of the die towards the active region but does not contact the active region. Advantageously, the first encapsulant forms a seal around the die to protect its active region from the environment. A further advantage is that the first encapsulant provides added security that bond pads of the die will remain in contact with contacts formed among the substrate even after distortion of the shape of the die.

4 Claims, 4 Drawing Sheets

U.S. PATENT DOCUMENTS

| | | | |
|---|---|---|---|
| 4,864,470 A | * 9/1989 | Nishio | 361/405 |
| 5,118,370 A | 6/1992 | Ozawa | 156/73.1 |
| 5,200,631 A | 4/1993 | Austin et al. | 257/81 |
| 5,241,133 A | 8/1993 | Mullen, III et al. | 174/52.4 |
| 5,331,512 A | 7/1994 | Orton | 361/760 |
| 5,336,931 A | 8/1994 | Juskey et al. | 257/787 |
| 5,352,852 A | 10/1994 | Chun | 174/52.4 |
| 5,357,056 A | 10/1994 | Nagano | 174/52.4 |
| 5,371,404 A | 12/1994 | Juskey et al. | 257/659 |
| 5,436,203 A | 7/1995 | Lin | 437/209 |
| 5,438,216 A | 8/1995 | Juskey et al. | 257/434 |
| 5,478,007 A | 12/1995 | Marrs | 228/180.22 |
| 5,495,450 A | 2/1996 | Zollo et al. | 365/218 |
| 5,577,319 A | 11/1996 | Knecht | 29/827 |
| 5,639,989 A | 6/1997 | Higgins, III | 174/35 MS |
| 5,654,243 A | 8/1997 | Yoneda et al. | 29/840 |
| 5,656,857 A | 8/1997 | Kishita | 257/690 |
| 5,753,857 A | 5/1998 | Choi | 174/52.4 |
| 5,776,798 A | 7/1998 | Quan et al. | 438/112 |
| 5,784,260 A | 7/1998 | Fuller, Jr. et al. | 361/762 |
| 5,786,589 A | 7/1998 | Segawa et al. | 250/208.1 |
| 5,808,330 A | * 9/1998 | Rostoker et al. | 257/204 |
| 5,861,680 A | 1/1999 | Yamanaka | 257/793 |
| 5,866,953 A | 2/1999 | Akram et al. | 257/790 |
| 5,867,368 A | 2/1999 | Glenn | 361/783 |
| 5,893,723 A | 4/1999 | Yamanaka | 438/65 |
| 5,895,222 A | 4/1999 | Moden et al. | 438/4 |
| 5,939,784 A | 8/1999 | Glenn | 257/710 |
| 5,949,655 A | 9/1999 | Glenn | 361/783 |
| 5,950,074 A | 9/1999 | Glenn et al. | 438/121 |
| 5,962,810 A | 10/1999 | Glenn | 174/52.2 |
| 5,969,461 A | * 10/1999 | Anderson et al. | 310/313 |
| 5,972,738 A | 10/1999 | Vongfuangfoo et al. | 438/124 |
| 5,981,314 A | 11/1999 | Glenn et al. | 438/127 |
| 5,989,941 A | 11/1999 | Wensel | 438/127 |
| 6,034,429 A | 3/2000 | Glenn et al. | 257/701 |
| 6,092,281 A | 7/2000 | Glenn | 29/841 |
| 6,117,705 A | 9/2000 | Glenn et al. | 438/106 |

\* cited by examiner

SURFACE ACOUSTICAL WAVE FLIP CHIP

FIELD OF THE INVENTION

The present invention relates to the art of electronic packaging and more particularly to a method of packaging a surface acoustical wave device and the resulting structure.

BACKGROUND OF THE INVENTION

Surface acoustical wave devices ("SAW devices"), also referred to as standing acoustical wave devices, are piezoelectric electronic components which traditionally are used as narrow band frequency filters, e.g., frequency determining elements in high frequency control applications. During use, an acoustical wave is propagated across the active region of the surface of the SAW device. (The active region is also often referred to as the propagating surface.)

As is well known to those skilled in the art, to prevent disruption of the acoustical wave, the package for the SAW device (the SAW package) must not contact the active region of the SAW device, i.e., the SAW device must be packaged so that a contamination free sealed space exists over the active region of the SAW device. The active region must be allowed to flex.

One conventional method used to form a SAW package is to solder a metal lid over the SAW device leaving a hermetically sealed air gap over the active region. However, metal lids are relatively expensive, which increases the cost of the SAW package. Further, the SAW device becomes heated during some processes of soldering the metal lid, which may damage and ultimately destroy the SAW device.

Typically, plastic molding is not used to package SAW devices because the plastic comes in contact with the SAW device thereby not allowing an acoustical wave to occur by the flexing of the active region.

Accordingly, what is needed is a SAW package which can be fabricated at low cost and does not suffer the drawbacks of the plastic molding.

SUMMARY

The present invention includes a mounting for a flip chip surface acoustical wave ("SAW") device. In one embodiment, the SAW device includes a first surface having an active region between a first conductive pad and a second conductive pad. The first and second conductive pads are located on the first surface and on opposite ends of the active region. The SAW device is mounted on a substrate. The substrate includes a first surface having conductive contacts thereon. Conductive connections are present between the first and second conductive pads and corresponding contacts on the first surface of the substrate. A first encapsulant contacts and circumscribes a periphery of the SAW device. Importantly, the first encapsulant, the first surface of the SAW device, and the first surface of the substrate define a free space adjacent to the active region.

The present invention also includes a method of mounting a SAW device. In one embodiment, action 1 of the method provides a SAW device having a first surface and a periphery. The first surface includes an active region between a first conductive pad and a second conductive pad. The conductive pads are located on the first surface and on opposite ends of the active region. Action 2 mounts the SAW device on a substrate so that the first surface of the SAW device faces a first surface of the substrate and each of the first and second conductive pads is juxtaposed with a corresponding conductive contact on the first surface of the substrate. Action 3 forms a conductive connection between each of the first and second conductive pads and the corresponding conductive contact on the substrate. Action 4 applies a viscous first encapsulant material onto the first surface of the substrate so as to circumscribe the periphery of the SAW device. The first encapsulant, the first surface of the SAW device, and the first surface of the substrate define a free space. Finally, action 5 hardens the first encapsulant material.

Advantageously, the first encapsulant forms a seal around the SAW device to protect its active region from the environment. A further advantage provided by the first encapsulant is added security that the conductive pads of the SAW device will remain in a connection with the contacts of the substrate even after distortion of the shape of the SAW device.

The present invention is better understood upon consideration of the detailed description below, in conjunction with the accompanying drawings.

DETAILED DESCRIPTION

Several elements in the following figures are substantially similar. Therefore, similar reference numbers are used to represent similar elements. All parameters and dimensions herein are exemplary.

SAW Device

Figure 1A:
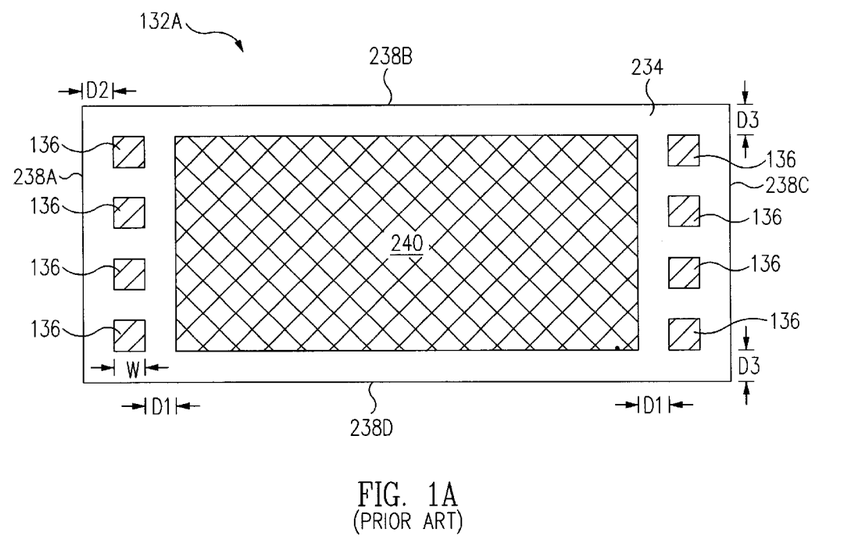
FIG. 1A depicts a top plan view of a conventional rectangle shaped SAW device.
Figure 1B:
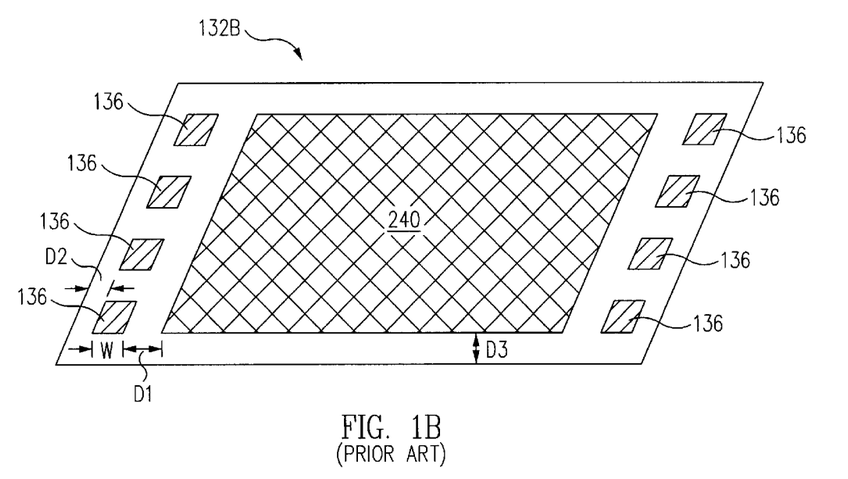
FIG. 1B depicts a top plan view of a conventional parallelogram shaped SAW device.

FIG. 1A depicts a top plan view of an exemplary conventional rectangular-shaped SAW device 132A. FIG. 1B depicts a top plan view of an alternative exemplary conventional parallelogram shaped SAW device 132B. For simplicity, embodiments of the present invention are described with respect to SAW device 132A of FIG. 1A, although SAW device 132B shown in FIG. 1B can be used.

SAW device 132A includes a first surface 234 with two opposing rows of four metal bond pads 136 formed thereon. Bond pads 136 allow electrical interconnection with internal circuitry (not shown) of SAW device 132A.

SAW device 132A further includes a second surface 242 (not depicted), that is opposite first surface 234, and peripheral side surfaces 238A, 238B, 238C, and 238D, which are each located between first surface 234 and second surface 242. Peripheral side surfaces 238A and 238C are opposite and parallel to each other. Peripheral surfaces 238B and 238D are opposite and parallel to each other.

Bond pads 136 also define an active region 240 of first surface 234 central to bond pads 136, i.e. inward of bond pads 136. Active region 240 includes, for example, a metallization pattern, which vibrates during operation of SAW device 132A.

Each of bond pads 136 is rectangular and has a width W of, for example, 100 µm. A distance D1 is between bond pads 136 and active region 240. D1 may be, for example, 250 µm. A distance D2 is between each row of bond pads 136 and the adjacent peripheral surface 238A or 238C. D2 may be for example, approximately 200 µm. A distance D3 is between each peripheral side surface 238B and 238D and active region 240. D3 may be for example, approximately 200 µm.

First Embodiment

Figure 2:
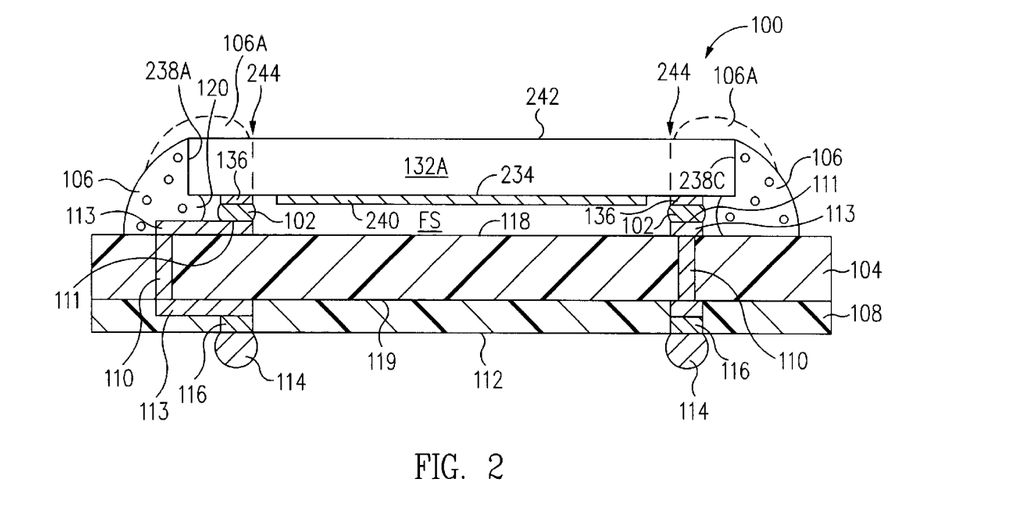
FIG. 2 depicts a cross sectional view of a structure in accordance with an embodiment of the present invention.

An embodiment of the present invention includes a mounting 100 depicted in FIG. 2. As shown in FIG. 2, mounting 100 includes a flip chip SAW device 132A that is electrically coupled to conductive contacts on a conventional planar substrate 104. Encapsulant 106 is on first surface 118 of substrate 104 and contacts and circumscribes the periphery of the SAW device 132A.

An active region 240, on a first surface 234 of SAW device 132, faces first surface 118 of substrate 104. Active region 240 does not contact first surface 118 of substrate 104.

Each bond pad 136 of SAW device 132A is conductively coupled by a conventional solder bump 102 to a juxtaposed contact 111 on first surface 118 of substrate 104. In other words, SAW device 132A is mounted in a "flip chip connection". Contacts 111 are connected to a metallized via 110 that extends through substrate 104.

Substrate 104 is an electrical insulator. Substrate 104 is approximately 0.5 mm to 1 mm thick. A conventional solder mask 108 covers a second surface 119 of substrate 104 that is opposite first surface 118 of substrate 104. Solder mask 108 is electrically insulative. An exemplary solder mask 108 is approximately 100 µm thick.

Metal vias 110 extend from first surface 118 of substrate 104 through substrate 104 to protrude from second surface 119 of substrate 104, within solder mask 108. Each metal via 110 is electrically coupled to a distinct metallization 116 on second surface 119. Each metallization 116 is located substantially within solder mask 108. Each metallization 116 is conductively coupled to a distinct metal solder ball 114. Each ball 114 substantially protrudes from a lower first surface 112 of solder mask 108. Thus metal vias 110 conductively couple contacts 111 to balls 114. Balls 114 can be coupled for example to contacts of a conventional printed circuit board (not depicted). In an alternative embodiment, solder balls 114 are omitted and metallizations 116 are conductively connected (e.g., by solder) to contacts of a printed circuit board, as in a leadless chip carrier style package.

FIG. 2 (and FIGS. 3 and 4) shows two alternative conventional conductive paths through substrate 104 between bond pads 136 and metallizations 116. A first path is shown in the right portion of the figures. There, via 110 is directly beneath contact 111 and extends vertically through substrate 104. An alternative second path is shown in the left portion of the figures. There, via 110 is laterally displaced from contacts 111 and metallizations 116. Metal trace 113 extends laterally on first surface 118 of substrate 104 and is connected between contact 111 and via 110. Similarly, a second metal trace 113 extends laterally on second surface 119 of substrate 104 within solder mask 108 and is connected between via 110 and metallizations 116.

As shown in FIG. 2, encapsulant 106, first surface 234 of SAW device 132A, active region 240 of SAW device 132A, and first surface 118 of substrate 104 define a free space FS. In this embodiment, encapsulant 106 forms a protective seal between SAW device 132A and substrate 104 and extends under SAW device 132A, i.e., between first surface 234 of SAW device 132A and first surface 118 of conventional substrate 104, but does not extend as far as or contact bond pads 136 or solder bumps 102. An exemplary distance that encapsulant 106 extends under SAW device 132A and inward from surfaces 238A and 238C is 200 µm. Herein "inward" means towards the active region 240 from either surface 238A or 238C unless otherwise specified. Encapsulant 106 does not extend inward from surfaces 238B and 238D, although some inward extension is possible in an alternative embodiment.

An exemplary distance along first surface 118 of conventional substrate 104 that encapsulant 106 extends outward from each of surfaces 238A and 238C is 0.5 mm. Similarly, encapsulant 106 is further applied along first surface 118 of conventional substrate 104 a distance of 0.5 mm out from surfaces 238B and 238D (not depicted).

Second Embodiment

Figure 3:
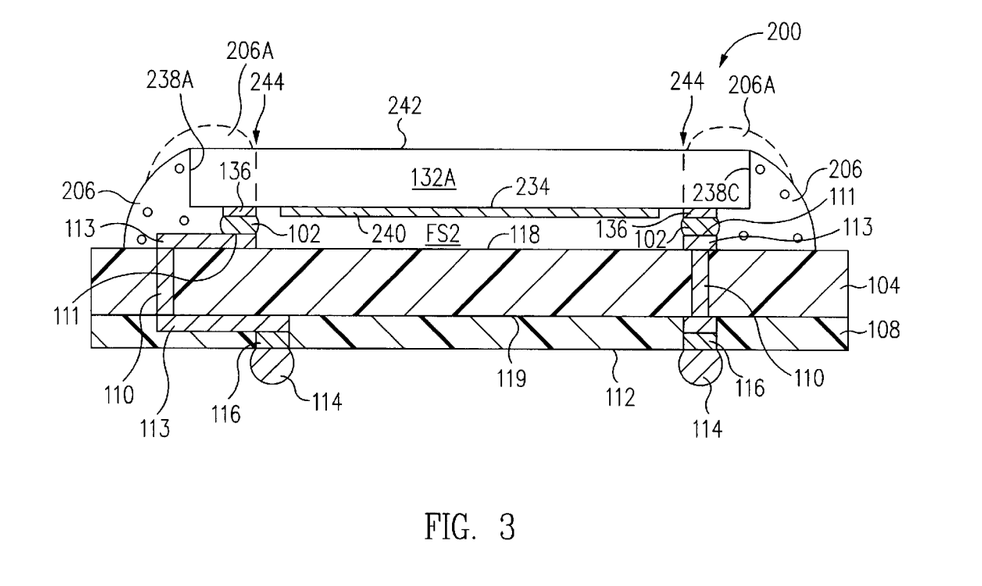
FIG. 3 depicts a structure in accordance with an embodiment of the present invention.

FIG. 3 depicts another embodiment of the present invention. Mounting 200 of FIG. 3 is identical to mounting 100 of FIG. 2 except for the encapsulant material that circumscribes SAW device 132A. In FIG. 3, encapsulant material 206 is on first surface 118 of substrate 104 and contacts and circumscribes the periphery of SAW device 132A. Encapsulant 206 forms a protective seal between SAW device 132A and first surface 118 of substrate 104 and extends under SAW device 132A, i.e., between lower surface 234 of SAW device 132A and first surface 118 of conventional substrate 104, and contacts but does not extend inward from bond pads 136 and solder bumps 102. An exemplary distance that encapsulant 206 extends under SAW device 132A, from both surfaces 238A and 238C, is 500 µm. Encapsulant 206 does not extend inward from surfaces 238B and 238D, although some inward extension is possible in an alternative embodiment.

In this embodiment, an exemplary distance along first surface 118 of conventional substrate 104 that encapsulant 206 extends outward from each of surfaces 238A and 238C is 0.5 mm. Similarly, encapsulant 206 is further applied along first surface 118 of conventional substrate 104 a distance of 0.5 mm outward from each of surfaces 238B and 238D (not depicted).

In FIG. 3, a free space FS2, defined by encapsulant 206, first surface 118, and lower surface 234 of SAW chip 132A is smaller than the free space FS of FIG. 2.

Third Embodiment

Figure 4:
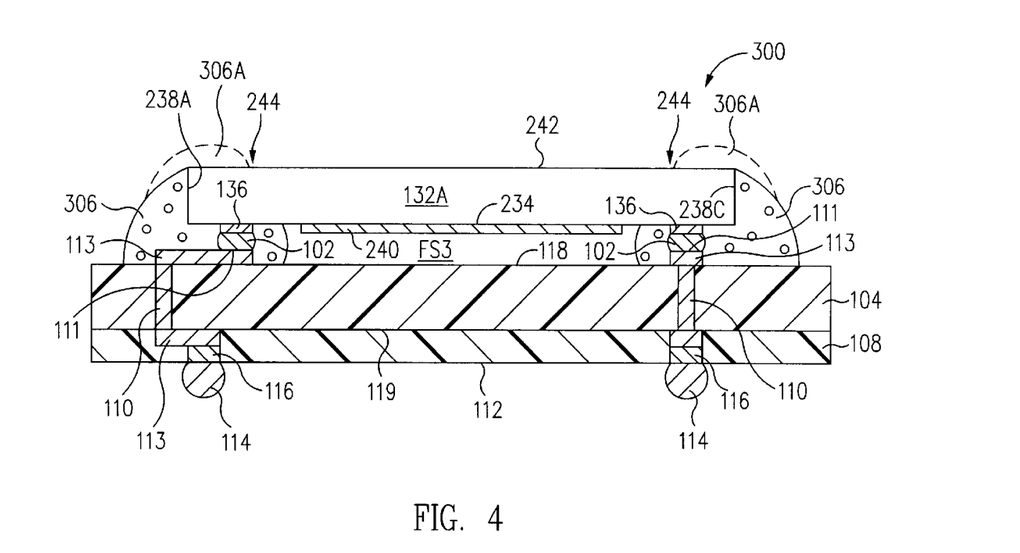
FIG. 4 depicts a structure in accordance with an embodiment of the present invention.

FIG. 4 depicts another embodiment of the present invention. Mounting 300 of FIG. 4 is identical to mounting 100 of FIG. 2 except for the encapsulant material that circumscribes SAW device 132A. In FIG. 4, encapsulant material 306 is on first surface 118 of substrate 104 and contacts and circumscribes the periphery of SAW device 132A. Encapsulant 306 forms a protective seal between SAW device 132A and substrate 104 and extends under SAW device 132A, i.e., between lower surface 234 of SAW device 132A and first surface 118 of conventional substrate 104, and contacts and extends inward from bond pads 136 but does not contact active region 240. An exemplary distance encapsulant 306 extends inward from each of surfaces 238A and 238C is approximately less than 550 µm. Encapsulant 306 does not extend inward from surfaces 238B and 238D, although some inward extension is possible in an alternative embodiment.

An exemplary distance along first surface 118 of conventional substrate 104 that encapsulant 306 extends outward from surfaces 238A and 238C is 0.5 mm. Similarly, encapsulant 306 is further applied along first surface 118 of conventional substrate 104 a distance of 0.5 mm outward from surfaces 238B and 238D (not depicted).

In FIG. 4, a free space FS3, defined by encapsulant 306, first surface 118, and lower surface 234 of SAW chip 132A, is smaller than FS2 of FIG. 3 or FS of FIG. 2.

Perspective View

Figure 5:
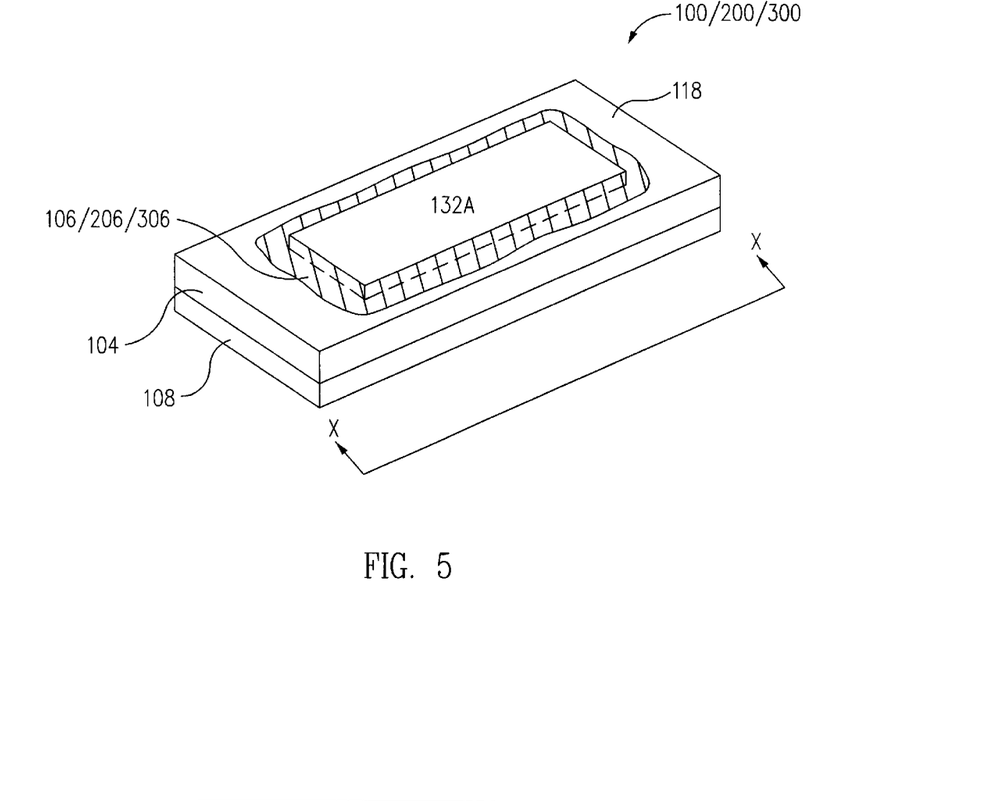
FIG. 5 depicts a perspective view of a structure in accordance with an embodiment of the present invention.

FIG. 5 depicts a perspective view of each of mountings 100, 200, and 300 of respective FIGS. 2, 3, and 4. FIGS. 2, 3, and 4 correspond to views in the direction X—X of FIG. 5. In particular, FIG. 5 shows encapsulant 106, 206, and 306 of FIGS. 2, 3, and 4 on first surface 118 of conventional substrate 104 and circumscribing and contacting SAW device 132A.

Fourth Embodiment

In accordance with another embodiment of the present invention, encapsulant 106 of FIG. 2, encapsulant 206 of FIG. 3, and encapsulant 306 of FIG. 4 can each be extended to cover a peripheral portion of second surface 242 of SAW device 134A inward from surfaces 238A and 238C. Each of FIGS. 2, 3, and 4 shows this alternative encapsulant in dashed lines. Encapsulants 106A, 206A, and 306A of FIGS. 2, 3, and 4 respectively extend onto a peripheral portion of second surface 242 of SAW device 132A but do not extend inward from point 244 on surface 242. Point 244 corresponds to the most inward location of bond pads 136 on the first surface 234 of SAW device 132A. In these embodiments, encapsulant does not cover a portion of second surface 242 (opposite first surface 234) inward from surfaces 238B and 238D, although an alternative embodiment may have such a configuration.

The further inward from surfaces 238A and 238C that encapsulant 106A, 206A, or 306A extend along second surface 242, the more secure the coupling among bumps 102, contacts 136, and contacts 111, but the less SAW device 132A can vibrate. Thus, one can vary the extent of inward travel of encapsulant 106A, 206A, and 306A along second surface 242 from surfaces 238A and 238C depending on a desired amount that SAW device 132A must vibrate.

Method

Figure 6:
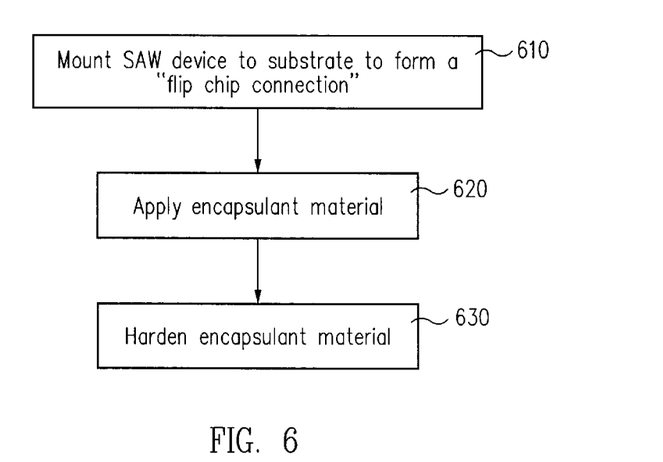
FIG. 6 depicts a flow chart of a method to make a mounting in accordance with an embodiment of the present invention.

FIG. 6 depicts a flow chart of an inventive method to make a mounting in accordance with an embodiment of the present invention. In action 610, a SAW device 132A is provided and each bond pad 136 of SAW device 132A is conductively coupled by a conventional solder bump 102 to a juxtaposed contact 111 on first surface 118 of substrate 104. In other words, SAW device 132A is mounted in a "flip chip connection". Contacts 111 are connected to a metallized via 110 that extends through substrate 104.

In action 620, encapsulant material is applied onto first surface 118 of substrate 104 and forms a protective seal between SAW device 132A and substrate 104. The encapsulant material is applied to form encapsulants 106, 106A, 206, 206A, 306, and/or 306A, each described with respect to FIGS. 2, 3, and 4. A variety of encapsulant materials may be used. The encapsulant material is adhesive and nonconductive. The encapsulant material should also have a property of zero stress, i.e., the material should flex from an application of any force, and should not form air bubble apertures that could allow moisture to enter the free space. Exemplary materials include HYSOL 4451 available from the Dexter Hysol Company, or 3-silicone, Q36646, or RTV materials, each available from Dow Corning Company.

An exemplary method to apply encapsulants 106, 106A, 206, 206A, 306, and 306A is to use a conventional needle dispenser such as a CAMELOT or TECHON dispenser in at most a class 10 environment, i.e., an environment having at most 10 particles, one micron or less in size, per cubic foot.

In action 630, the resulting structure is heated to a temperature of 110° C. to 140° C. for a duration of 120 minutes. The heating hardens the encapsulant material.

Advantages

In view of the above discussion and FIGS. 2 to 5, advantages of the present inventions are apparent. Encapsulants 106, 106A, 206, 206A, 306, and 306A of FIGS. 2 to 4 form a protective seal around SAW device 132A and allow a free space between active region 240 and first surface 118 of substrate 104. Contamination of the free space such as by moisture and dust is prevented. Further, the metal cover used in conventional designs is eliminated, as is the associated possibility of heating danger to the SAW devices (see the discussion above).

As shown in FIGS. 2 to 4, the extent to which the encapsulant material around SAW device 132A extends inward on surface 118 of substrate 104 from surfaces 238A and 238C towards active region 240 can vary within the present invention. The extent of travel of encapsulant toward active region 240 has performance tradeoffs. One the one hand, the further inward from surfaces 238A and 238C along the first surface 118 of substrate 104 that encapsulants 106, 206, and 306 extends, the more secure the seal around SAW device 132A, but the less SAW device 132A can vibrate. As discussed above, such vibration is a fundamental aspect of the performance of SAW devices.

A further advantage of mounting embodiments of the present invention is that encapsulants 106, 106A, 206, 206A, 306, and 306A provide added reliability. As is well known in the field of packaging, operation of SAW device 132A causes expansion of SAW device 132A due to heating. The expansion can cause bond pads 136, bumps 102, or contacts 111 to disconnect. By filling a region between SAW device 132A and substrate 104 with encapsulant 106, 206, or 306 (FIGS. 2 to 4), bond pads 136, bumps 102, and contacts 111 will remain in contact even after distortion of the shape of SAW device 132A. In this regard, encapsulant 306 of FIG. 4, provides a stronger bond among bumps 102, contacts 136, and contacts 111 than encapsulants 106 and 206 (FIGS. 2 and 3) because more encapsulant material covers bumps 102, contacts 136, and contacts 111.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true scope of this invention.

What is claimed is:

1. A mounting for a surface acoustical wave ("SAW") device comprising:

a SAW device including a first surface having an active region, a first conductive pad, and a second conductive pad, wherein said first and second conductive pads are located on said first surface and on opposite ends of said active region;

a substrate including a continuous first surface, said first surface having conductive contacts thereon;

a first conductive connection between said first conductive pad and a corresponding contact on said first surface of said substrate;

a second conductive connection between said second conductive pad and a corresponding contact on said first surface of said substrate; and a first encapsulant contacting and circumscribing a periphery of said SAW device, wherein said first encapsulant, said first surface of said SAW device, and said continuous first surface of said substrate define a free space, and said first encapsulant extends inwards along said first surface of said SAW device from the periphery of said SAW device towards said active region but does not contact said active region or said first and second conductive connections.

2. The mounting of claim 1, wherein said SAW device includes a second surface opposite said first surface, said second surface having a peripheral portion adjacent to the periphery of said SAW device and a central area within said peripheral portion and opposite said active region of said first surface; and said first encapsulant contacts said peripheral portion of said second surface, but does not cover said central portion.

3. A mounting for a surface acoustical wave ("SAW") device comprising:

a SAW device in a flip chip electrical connection with a substrate, said SAW device having a first surface with an active region juxtaposed with a first, continuous surface of said substrate; and a hardened first encapsulant on the substrate and contacting and circumscribing a periphery of said SAW device, wherein said first encapsulant, said first surface, and said substrate define a free space adjacent said active region, said flip chip electrical connection includes electrical connections between the first surface and the substrate, with the active region being between the electrical connections, and said first encapsulant extends inward from said periphery between said first surface and said substrate without contacting said electrical connections.

4. The mounting of claim 3, wherein said SAW device includes a second surface opposite said first surface, and said first encapsulant covers a peripheral portion of said second surface without covering a central portion of the second surface.

* * * * *

UNITED STATES PATENT AND TRADEMARK OFFICE
CERTIFICATE OF CORRECTION

PATENT NO. : 6,448,635 B1
DATED : September 10, 2002
INVENTOR(S) : Thomas P. Glenn It is certified that error appears in the above-identified patent and that said Letters Patent is hereby corrected as shown below:

<u>Column 4,</u>
Line 32, delete "500" and insert -- 300 --

Signed and Sealed this

Fifteenth Day of April, 2003

JAMES E. ROGAN
*Director of the United States Patent and Trademark Office*